United States Patent [19]

Asano

[11] 4,045,691
[45] Aug. 30, 1977

[54] LEVEL SHIFT CIRCUIT

[75] Inventor: Kazuhiro Asano, Tokyo, Japan

[73] Assignee: Kabushiki Kaisha Daini Seikosha, Japan

[21] Appl. No.: 725,266

[22] Filed: Sept. 21, 1976

[30] Foreign Application Priority Data

Sept. 22, 1975 Japan .................................. 50-114542

[51] Int. Cl.$^2$ ...................... H03K 5/02; H03K 3/353; H03K 17/60

[52] U.S. Cl. ..................................... 307/264; 307/208; 307/251; 307/DIG. 1; 58/23 A; 58/50 R

[58] Field of Search ............... 307/203, 205, 208, 214, 307/251, 264, DIG. 1, 270, 304; 58/23 R, 23 A, 23 BA, 50 R

[56] References Cited

U.S. PATENT DOCUMENTS

| | | | |
|---|---|---|---|
| 3,675,144 | 7/1972 | Zuk | 307/251 X |
| 3,842,411 | 10/1974 | Naito | 307/DIG. 1 X |
| 3,900,746 | 8/1975 | Kraft et al. | 307/DIG. 1 X |
| 3,916,430 | 10/1975 | Heuner et al. | 307/DIG. 1 X |
| 4,000,412 | 12/1976 | Rosenthal et al. | 307/264 X |
| 4,006,491 | 2/1977 | Alaspa et al. | 307/304 X |

Primary Examiner—John S. Heyman
Assistant Examiner—Larry N. Anagnos
Attorney, Agent, or Firm—Robert E. Burns; Emmanuel J. Lobato; Bruce L. Adams

[57] ABSTRACT

A level shift circuit comprises an inverter connected to a first voltage supply source and supplied with an input pulse. A condenser and a directional switching element are connected in series between the output point of the inverter and one potential point of the first voltage supply source. The input of a first MOS-FET is connected to the output of the inverter while the input of a second MOS-FET is connected to a connection point between the condenser and the directional switching element. The source of the first MOS-FET is connected to a common terminal of first and second voltage supply sources while the source of the second MOS-FET is connected to the other terminal of the second voltage supply source. An output voltage is generated between a common connecting point of the drains of the first and second MOS-FETs and one potential point of the second voltage supply source.

4 Claims, 5 Drawing Figures

LEVEL SHIFT CIRCUIT

FIELD OF INVENTION

The present invention relates to a level shift circuit and particularly to a level shift circuit of small size suitable for use, for example, in a watch.

BACKGROUND OF INVENTION

A level shift circuit is generally employed for transferring a signal generated by a circuit having a low voltage level to a circuit having a higher voltage level. Level shift circuits composed of a plurality of MOS-FETs have been heretofore proposed. However, such level shift circuits have not been found to be entirely reliable in their operation. Moreover, because of special characteristics required for MOS-FETs used in the circuit, they must be made larger so that it has not been found possible to make such a circuit of a sufficiently small size.

SUMMARY OF INVENTION

It is an object of the present invention to overcome the disadvantages of the prior art and to provide a level shift circuit which is accurate in its operation and can be made of small size.

In accordance with the invention, an inverter is connected to a first voltage supply supply source and is operated by an input pulse. A condenser and a directional switching element are connected in series between the output of the inverter and one potential point of the first voltage supply source. The gate of a first MOS-FET is connected to the output of the inverter while the gate of a second MOS-FET is connected to the connection point between the condenser and the directional switching element. The source of the first MOS-FET is connected to a common terminal of first and second voltage supply sources while the source of the second MOS-FET is connected to the other terminal of the second voltage supply source. An output voltage is generated between the last mentioned terminal and a common connecting point of the drains of the first and second MOS-FETs. With the construction in accordance with the invention, it has been found that the level shift circuit can be made of small size while yet assuring dependable operation.

BRIEF DESCRIPTION OF DRAWINGS

The nature, objects and advantages of the invention will be more fully understood from the following description in conjunction with the accompanying drawings, in which.

DESCRIPTION OF PRIOR ART

Figure 1:
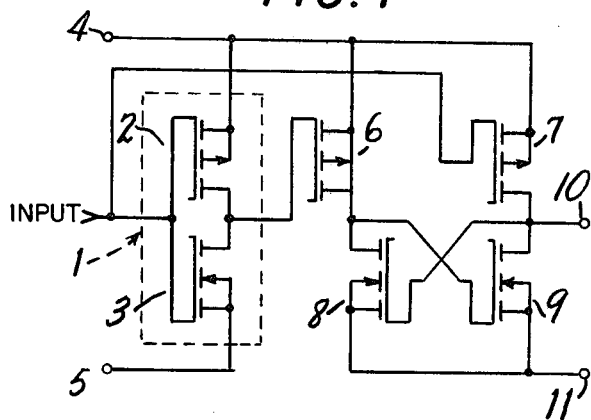
FIG. 1 is a circuit diagram of a level shift circuit of known type.

A conventional level shift circuit shown by way of example in FIG. 1 comprises an inverter 1 composed of a P type MOS-FET 2 and an N type MOS-FET 3 connected with complementary connection. The source of the P type MOS-FET 2 is connected to a common potential terminal 4 of a first and second voltage supply source. The source of the N type MOS-FET 3 is connected to the other terminal 5 of the first voltage supply source. The output of the inverter 1 is connected to the gate of P type MOS-FET 6 of which the source is connected to the common potential terminal 4. The drain of the P type MOS-FET 6 is connected to the drain of an N type MOS-FET 8 and to the gate of an N type MOS-FET 9.

The input of the inverter 1 is connected to the gate electrode of a P type MOS-FET 7, the source of which is connected to the common potential terminal 4. The drain electrode of the P type MOS-FET 7 is connected to the gate of N type MOS-FET 8 and to the drain of N type MOS-FET 9. The drains of MOS-FET 7 and MOS-FET 9 are connected to an output terminal 10. The source electrodes of N type MOS-FETs 8 and 9 are connected to the other terminal 11 of the second voltage supply source.

In a conventional level shift circuit as illustrated in FIG. 1, an input pulse corresponding to the first supply voltage is applied to the input side of the inverter 1. A pulse signal corresponding to the second supply voltage is generated from the output terminal 10. Therefore, the P type MOS-FET 6 is in ON condition and the P type MOS-FET 7 is in OFF condition when the input pulse is at logic level "1". The N type MOS-FET 8 is in OFF condition and the N type MOS-FET 9 is in ON condition. The logic "0" signal equal to the potential of the terminal 11 of the second supply voltage source appears at the output terminal 10.

When the input pulse has changed from logic "1" to "0", the P type MOS-FET 6 changes to OFF condition and the P type MOS-FET 7 changes to ON condition. The N type MOS-FET 8 changes to ON condition in response to the operation of P type MOS-FET 7 and N type MOS-FET 9 changes to OFF condition in response to the operation of the P type MOS-FET 6, whereby a signal of a potential equal to the potential of terminal 4 is applied to the output terminal 10. However, when the ON resistance between P type MOS-FETS 6 and 7 is equal to the ON resistance between N type MOS-FETs 8 and 9, a voltage between gate and source electrodes sufficient for changing N type MOS-FET 8 to ON condition is not obtained. Accordingly, N type MOS-FET 9 is kept in ON condition when the input pulse changes from logic "1" to "0". Furthermore, N type MOS-FET 6 does not attain the voltage for changing to OFF condition according to N type MOS-FET 8 being kept in OFF condition. As a result, P type MOS-FET 6 becomes to OFF condition, P type MOS-FET 7 becomes to ON condition, N type MOS-FET 8 becomes to OFF condition and N type MOS-FET 9 becomes to ON condition whereby a voltage signal of half the second supply voltage is generated at the output terminal.

As a means for eliminating the above noted difficulty and insufficiency, it is necessary to reduce the ON resistance of P type MOS-FETs 6 and 7 to a value lower than the ON resistance of N type MOS-FETs 8 and 9. Thus, it is necessary to make the P type MOS-FETs 6 and 7 with a broader gate than N type MOS-FETs 8 and 9 in order to obtain a small ON resistance of the P type MOS-FETs 6 and 7. Further, it is necessary to provide a long distance between the drain and source of N type MOS-FETs 8 and 9 in order to obtain a large ON resistance. Thus, each of the MOS-FETs becomes larger as a result of which the level shift circuit as a whole unavoidably becomes larger.

DESCRIPTION OF THE PREFERRED EMBODIMENT

The present invention makes it possible to obtain a shift level circuit which is smaller than those heretofore available and yet assures dependable operation. As shown by way of example in FIG. 2, a shift level circuit in accordance with the invention comprises an inverter 12 composed of a P type MOS-FET 13 and an N type MOS-FET 14 connected in complementary connection. The source of P type MOS-FET 13 is connected to a common terminal 15 of first and second voltage supply sources. The source of N type MOS-FET 14 is connected to the other terminal 16 of the first voltage supply source. The input side of the inverter 12 is connected to an input terminal 17 to which an input pulse is applied. The output side of the inverter 12 is connected to the gate of a P type MOS-FET 18 and to one terminal of a condenser 20. The other terminal of the condenser 20 is connected to the gate of N type MOS-FET 19 and to the anode of a diode 21 as a directional switching element. The cathode of the diode 21 is connected to the second terminal 16 of the first voltage supply source.

The source of the P type MOS-FET 18 is connected to the common terminal 15 of the first and second voltage supply sources while the source of N type MOS-FET 19 is connected to the second terminal 23 of the second voltage supply source. The drains of MOS-FETs 18 and 19 are connected together and to an output terminal 22.

Figure 2:
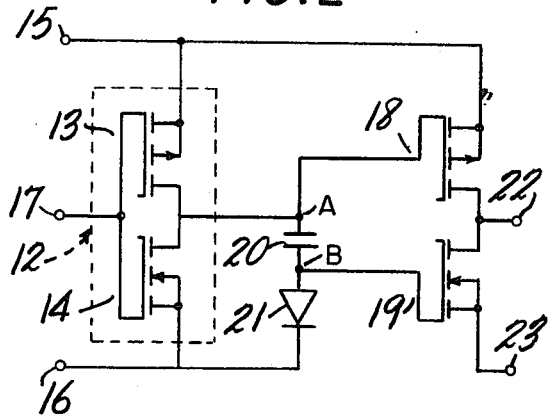
FIG. 2 is a circuit diagram of a level shift circuit in accordance with the invention.
Figure 3:
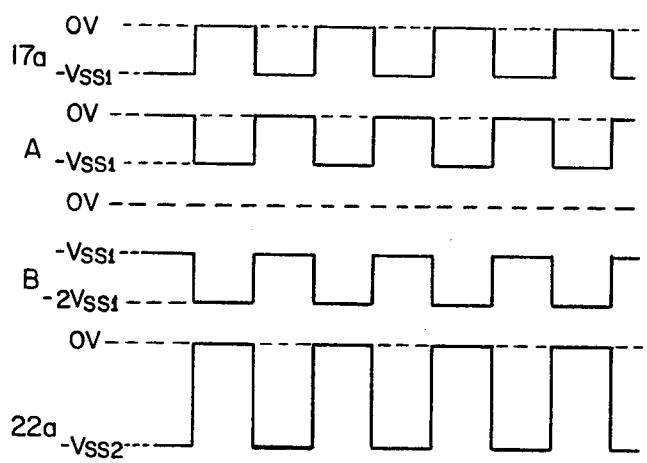
FIG. 3 shows waveforms for explaining the operation of the level shift circuit of FIG. 2.

The operation of the level shift circuit of the present invention as illustrated in FIG. 2 will now be described with reference to the waveforms shown in FIG. 3.

If the voltage of the common terminal 15 of the first and second voltage supply sources is 0 volt, the voltage of the terminal 16 of the first voltage source is $-VSS1$, the voltage of the terminal 23 of the second voltage supply source is $-VSS2$ and an input pulse of waveform 17a is applied to the input terminal 17, a signal of waveform A appears at the output point A of the inverter 12. If the voltage of the output point A is 0 volt, the voltage between the electrodes 20 is VSS1. The voltage of commonly connected point B between one electrode of the condenser 20 and the anode of the diode 21 is $-VSS1$. Accordingly, a voltage of $-VSS1$ is applied to the gate of the N type MOS-FET 19 which is connected to point B. If the threshold voltage VN of the N type MOS-FET 19 has the relation of:

$$VSS1 - 2VSS1 < VN < [VSS2] - [VSS1]$$

the N type MOS-FET 19 becomes to ON condition. If the threshold voltage VP of the P type MOS-FET 18 has the relation of $VP < [VSS1]$, the P type MOS-FET 18 becomes in OFF condition. Therefore, the voltage of the output terminal 22 becomes $-VSS1$.

When the input pulse 17a changes to logic "1" and the voltage of output point A of the inverter is thereby changed to $-VSS1$, a voltage of VSS1 is applied between the gate and source electrodes of the P type MOS-FET 18, whereby MOS-FET 18 changes to ON condition. The voltage of point B drops to $-2VSS1$ in response to the drop of voltage of the A point whereby the N type MOS-FET 19 changes to OFF condition by reason of the applied voltage of VSS2 $-$ 2VSS1 between the gate and source electrodes of N type MOS-FET 19. Therefore, the voltage of the output terminal 22 changes to 0 volts. The waveform B in FIG. 3 shows the voltage change at the B point, while the waveform 22a shows the output waveform at the output terminal 22.

As the P type MOS-FET 18 and N type MOS-FET 19 are independently operated by the condenser 20 and diode 21, a time error cannot occur and accurate operation is assured. Moreover, it is not necessary to employ large size MOS-FETs.

Figure 4:
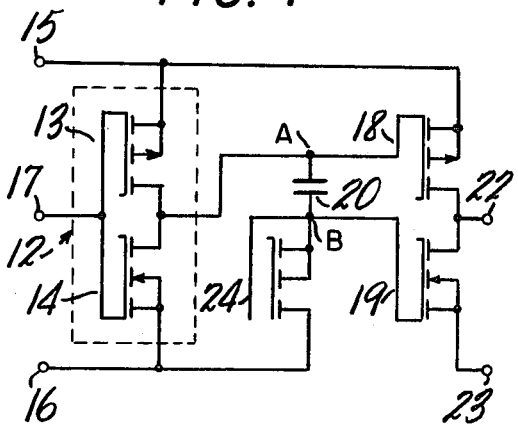
FIG. 4 is a circuit diagram of a second embodiment of the invention.

FIG. 4 shows another embodiment of the level shift circuit of the present invention in which an N type MOS-FET 24 is used as a directional switching element in place of the diode 21 of FIG. 2. Corresponding parts of the circuit of FIG. 4 are identified by the same reference numerals as in FIG. 2. The source and gate electrodes of the N type MOS-FET 24 are connected at point B to one terminal of the condenser 20 and to the gate of the N type MOS-FET 19. The drain of MOS-FET 24 is connected to the terminal 16 of the first voltage supply source. Therefore, the N type MOS-FET 24 becomes to ON condition when the voltage at point B is higher than the voltage of the terminal 16 and becomes to OFF condition when the voltage at point B is lower than the voltage at terminal 16. The N type MOS-FET 24 thus operates as a directional switching element in the same manner as the PN junction diode in the circuit of FIG. 2. The operation of the level shift circuit in FIG. 4 will thus be understood to be the same as that of the circuit shown in FIG. 2.

Figure 5:
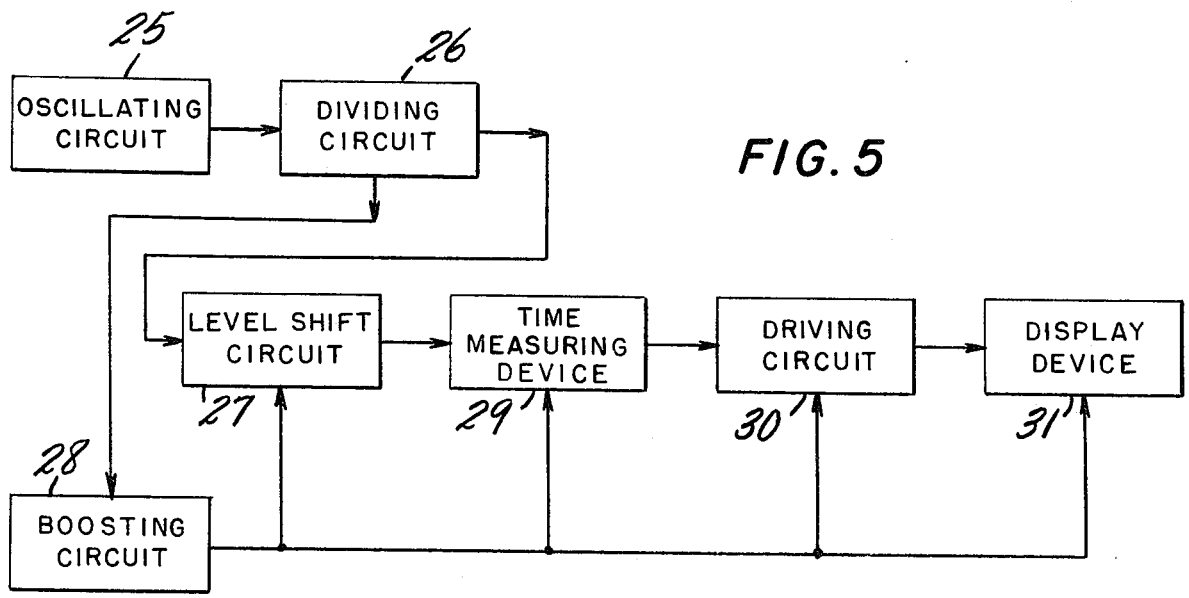
FIG. 5 is a block diagram of the circuitry of an electronic watch including the level shift circuit of the present invention.

FIG. 5 shows a block diagram of an electronic watch circuit using a level shift circuit in accordance with the present invention.

In the circuit illustrated in FIG. 5, a signal generated by an oscillating circuit 25 is divided by a dividing circuit 26 to obtain a 1 Hz standard pulse. This 1 Hz signal is applied to a level shift circuit 27 in accordance with the present invention. A first voltage applied to the oscillating circuit 25 or dividing circuit 26 and a second voltage obtained from a boosting circuit 28 are applied to the level shift circuit 27. Therefore, a standard pulse at the first voltage level applied to the level shift circuit 27 is shifted to a standard pulse of the second voltage level and is applied to a time measuring device 29 having a voltage level of the second supply voltage.

The time measuring device 29 is able to obtain a counting signal according to the input pulse and is able to change such signal to a suitably coded signal for display on the display device 31 driven by a driving circuit 30. The driving circuit 30 applies the signal to the display device 31 after amplification to a suitable level for display. The second voltage supply from the boosting circuit 28 is applied to the level shift circuit 27, the time measuring device 29, the driving circuit 30 and the display device 31.

As many modifications and variations may be made, it will be understood that the present invention is not limited to the embodiments illustrated by way of example in the drawing. For example, it is possible to employ a positive power source instead of a negative power source. In this case, it is necessary to employ an N type MOS-FET as the first FET and a P type MOS-FET as the second FET. Further, it is possible to use a small type condenser and directional switching element.

In a level shift circuit according to the present invention, the first MOS-FET is operated by the output of the inverter and the second MOS-FET is operated by the output of the inverter via a condenser, whereby it is possible to equalize the ON resistances of the first and second MOS-FETs and it is possible accurately to operate the MOS-FETs without requiring large size MOS-FETs. Thus, the entire level shift circuit becomes smaller and hence suitable for use where small circuitry is required, for example in a watch.

What I claim is:

1. A level shift circuit comprising an inverter, means for supplying a first voltage to said inverter, means for applying an input pulse to said inverter, a condenser, a directional switching element, and first and second MOS-FETs, means connecting an output of said inverter to one terminal of said condenser and to the gate of said first MOS-FET, means connecting a second terminal of said condenser to the gate of said second MOS-FET and through said directional switching element to one terminal of said first voltage supply means, means connecting the source of said first MOS-FET to the other terminal of said first voltage supply means, means connecting the source of said second MOS-FET to a second voltage supply means, and means connecting the drains of both of said MOS-FETs to an output terminal.

2. A level shift circuit according to claim 1, in which said inverter comprises a P type MOS-FET and an N type MOS-FET, said input pulse being applied to the gates of both of said MOS-FETs of said inverter, the source of said N type MOS-FET being connected to said one terminal of said first voltage supply means, the source of said P type MOS-FET being connected to said other terminal of said first voltage supply means and the drains of said MOS-FETs being connected together and comprising the output of said inverter.

3. A level shift circuit according to claim 1, in which said directional switching element comprises a diode the anode of which is connected to one terminal of said condenser.

4. A level shift circuit according to claim 1, in which said directional switching element comprises an N type MOS-FET having its gate and source connected to one terminal of said condenser and its drain connected to said one terminal of said first voltage supply means.

* * * * *